United States Patent
Seo et al.

(10) Patent No.: US 7,068,980 B2
(45) Date of Patent: Jun. 27, 2006

(54) PRE-DISTORTION APPARATUS AND METHOD FOR RECOVERING NONLINEAR DISTORTION OF HIGH POWER AMPLIFIER

(75) Inventors: Jae-Hyun Seo, Daegu (KR); Lee Yong Tae, Daejon (KR); Seung-Won Kim, Daejon (KR)

(73) Assignee: Electronics and Telecommunications Research Institute (KR)

( * ) Notice: Subject to any disclaimer, the term of this patent is extended or adjusted under 35 U.S.C. 154(b) by 448 days.

(21) Appl. No.: 10/282,758

(22) Filed: Oct. 29, 2002

(65) Prior Publication Data

US 2004/0203542 A1   Oct. 14, 2004

(30) Foreign Application Priority Data

Jun. 4, 2002   (KR) .................. 10-2002-0031332

(51) Int. Cl.
*H04B 1/04*   (2006.01)
*H01Q 11/12*   (2006.01)

(52) U.S. Cl. .................. 455/91; 455/114.3; 455/126; 375/296

(58) Field of Classification Search ............ 455/114.3, 455/114.2, 115.1, 126, 127.1; 375/296–297
See application file for complete search history.

(56) References Cited

U.S. PATENT DOCUMENTS

| | | | | |
|---|---|---|---|---|
| 5,699,383 A | * | 12/1997 | Ichiyoshi | 375/297 |
| 5,903,611 A | * | 5/1999 | Schnabl et al. | 375/297 |
| 5,920,808 A | * | 7/1999 | Jones et al. | 455/127.1 |
| 6,091,941 A | * | 7/2000 | Moriyama et al. | 455/126 |
| 6,141,390 A | * | 10/2000 | Cova | 375/297 |
| 6,240,144 B1 | * | 5/2001 | Ha | 375/297 |
| 6,801,581 B1 | * | 10/2004 | Francos et al. | 375/296 |
| 6,831,954 B1 | * | 12/2004 | Mandyam | 375/286 |
| 6,934,341 B1 | * | 8/2005 | Sahlman | 375/297 |
| 2002/0010567 A1 | * | 1/2002 | Kusunoki | 703/2 |
| 2003/0058959 A1 | * | 3/2003 | Rafie et al. | 375/296 |
| 2003/0072388 A1 | * | 4/2003 | Francos et al. | 375/296 |
| 2003/0076894 A1 | * | 4/2003 | Jin et al. | 375/296 |
| 2003/0179830 A1 | * | 9/2003 | Eidson et al. | 375/296 |

FOREIGN PATENT DOCUMENTS

| | | |
|---|---|---|
| JP | 11-177470 | 7/1999 |
| KR | 1020000031138 | 11/1998 |
| KR | 1999-0060378 | 7/1999 |
| KR | 1020010083262 | 12/1999 |

* cited by examiner

*Primary Examiner*—Simon Nguyen
(74) *Attorney, Agent, or Firm*—Blakely Sokoloff Taylor & Zafman

(57) ABSTRACT

A pre-distortion apparatus and method for recovering nonlinear distortion of a high power amplifier. The pre-distortion apparatus includes: a demodulator for demodulating a signal outputted from the high power amplifier, generating a demodulated signal; a first storage unit for storing the demodulated signal outputted from the demodulator; a second storage unit for storing a reference transmission signal outputted from a transmitter of a transmitting system; a digital signal processor for calculating a pre-distortion coefficient by comparing the demodulated signal and the reference transmission signal stored at the first storage unit and the second storage unit; and a third storage unit for storing the pre-distortion coefficient calculated at the digital signal processor.

11 Claims, 5 Drawing Sheets

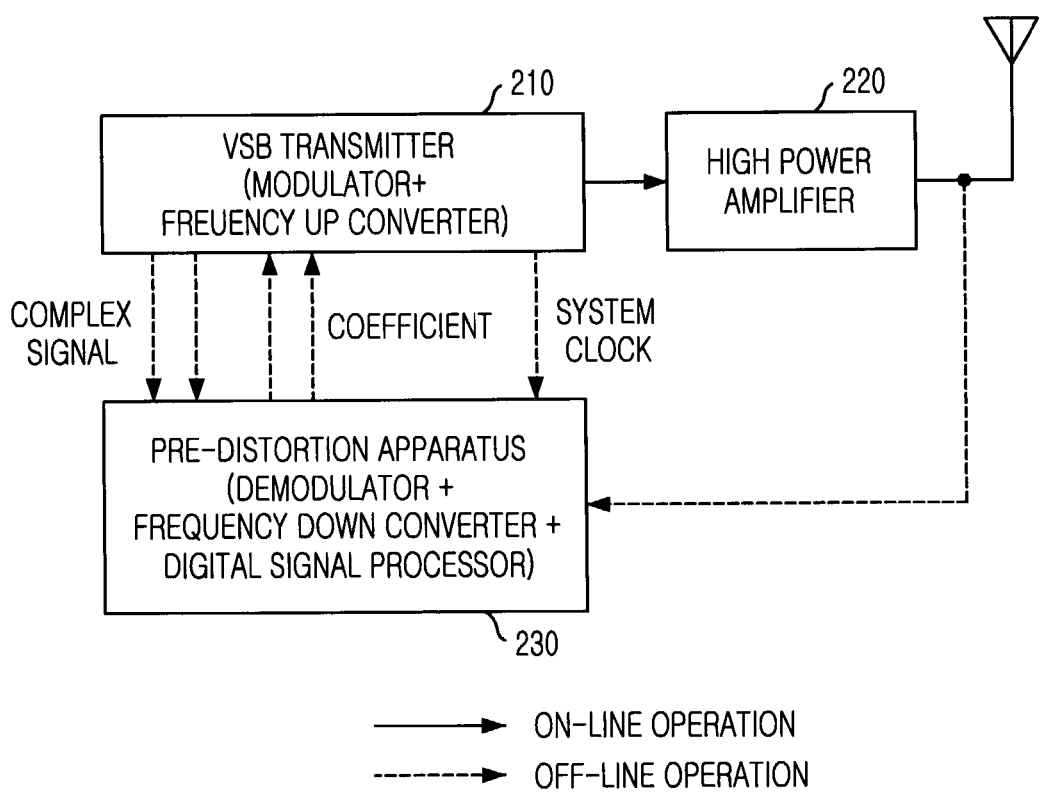

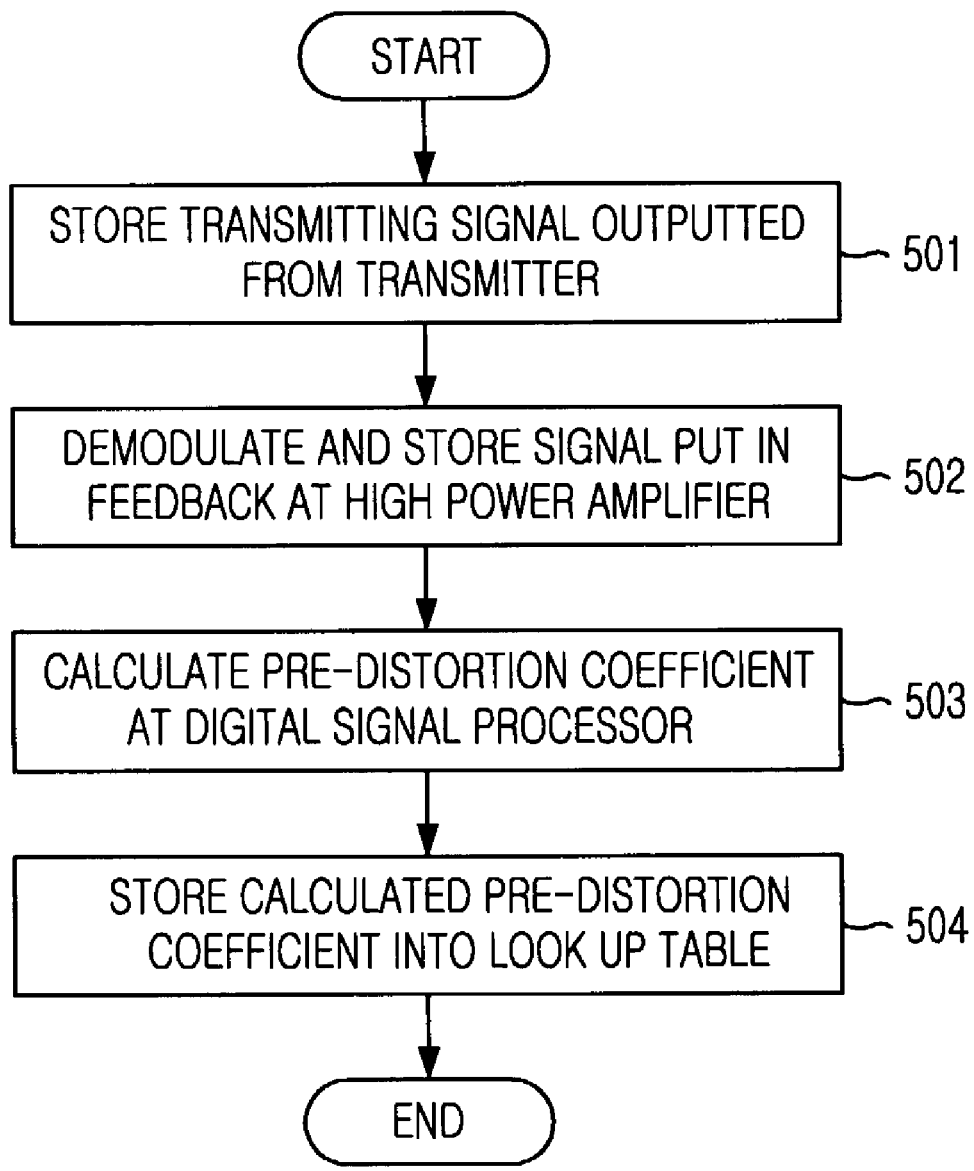

PRE-DISTORTION APPARATUS AND METHOD FOR RECOVERING NONLINEAR DISTORTION OF HIGH POWER AMPLIFIER

FIELD OF THE INVENTION

The present invention relates to a pre-distortion apparatus and method for recovering nonlinear distortion of a high power amplifier, and a computer readable recording medium storing instructions for implementing the method.

DESCRIPTION OF RELATED ARTS

In general, a high power amplifier is used to amplify a signal to be transmitted from satellites, mobile communications system, radio relay links, radars and so forth. Also, in a vestigial sideband (VSB) transmitter, which is a ground wave broadcasting system, the high power amplifier (HPA) is used at the last end of the VSB transmitter to send a transmission signal to broader areas.

High power amplifier is an apparatus for amplifying an output signal prior to transmitting a telecommunication/broadcasting signal. However, the high power amplifier has an amplitude modulation/amplitude modulation (AM/AM) characteristic and an amplitude modulation/phase modulation (AM/PM) characteristic, causing a transmission signal to be nonlinearly distorted.

FIGS. 1A and 1B are descriptive graphs representing nonlinear input and output signals of a general high power amplifier. Particularly, FIGS. 1A and 1B have amplitudes of normalized input signals of the high power amplifier plotted against amplitudes (shown in FIG. 1A) and phases (shown in FIG. 1B) of normalized output signals, respectively.

Firstly, the amplitudes and the phases of the output signals are determined on the basis of the amplitudes of the input signals. At this time, the amplitude of the input signal is normalized as the value of '1'.

Referring to FIGS. 1A and 1B, a degree of amplification of the amplitude is changed in accordance with an input signal power of the high power amplifier. A phase of the input signal and a phase of a signal passed through the high power amplifier are also changed in accordance with the input signal power of the high power amplifier.

In an amplitude modulation/amplitude modulation (AM/AM) mode as illustrated in FIG. 1A, the amplification degree decreases as the amplitude of the input signal increases, resulting in a nonlinear characteristics. Also, in an amplitude modulation/phase modulation (AM/PM) mode as shown in FIG. 1B, a phase distortion of the output signal proportionally increases as the amplitude of the input signal increases.

In other words, a nonlinear effect, introduced when using the high power amplifier, distorts a transmission signal and enlarges a bandwidth of a transmission signal. Because of this enlarged bandwidth, interference between nearly located channels occurs. Therefore, it is necessary to recover nonlinear distortion in order to improve functions of a transmitter by being capable of transmitting the signal to broader areas, increasing reception levels of a receiver and reducing errors of received signals.

The recovery for non-linearity is classified into two types. One is an input signal back-off method and the other is a pre-distortion method. The former method uses only linear areas of the high power amplifier and the latter method distorts the input signal of the high power amplifier.

Firstly, the most general method for reducing non-linearity of the high power amplifier is to reduce an amplitude of an input signal by using only linear areas instead of using all signals of the high power amplifier potentially possible to be inputted because the high power amplifier has a high level of nonlinear distortion at a high input signal. However, this method is very ineffective since it does not consider a property of the high power amplifier that changes in accordance with the time elapsed and the amplitude modulation/phase modulation. (AM/PM) effect.

Hence, the pre-distortion skill is suggested to improve the disadvantages of employing the input signal back-off method by recovering distorted portions of the high power inputs into linearity.

A pre-distortion apparatus for recovering nonlinear distortion of the high power amplifier provides distortion inversely before distortion occurs so that non-linearity of the high power amplifier becomes linearized.

That is, in order to recover the nonlinear distortion of the high power amplifier, the pre-distortion apparatus is used at a base-band in a front end of a transmitter so as to send a signal nonlinearly distorted in overall.

To construct the above apparatus, a demodulation unit is required to synchronize an oscillation frequency from the transmitter and calculate coefficient in accordance with an amplitude of a signal for pre-distortion.

Information disclosed statements related to the pre-distortion apparatus will be explained in below.

The Korean Patent application Laid-Open No. 10-2001-0083262 relates to an apparatus and a method for a high-speed adaptation pre-distortion with use of a look-up table. This apparatus is a pre-distortion algorithm particularly applicable for solving a non-linear effect instigated when using a high output and high power amplifier. Therefore, an object of this application is to provide an apparatus and a method for recovering adaptively change of amplification which occur because of high-speed initialization and time changes. A table of characteristics of the high power amplifier is formulated, and on the basis of this table, a look-up table is made by comparing a transmission signal with a demodulated signal. The transmission signal is pre-distorted and passed through the high power amplifier to recover non-linearity of the high power amplifier at every instance. Also, every transmission signal is demodulated without delaying so to perform initialization of the look-up table rapidly and renew appropriately characteristics of the high power amplifier, thereby effectively performing the pre-distortion.

However, since the transmission signal in the above method is demodulated at every instance without any delay, such devices as a frequency synchronization unit, a symbol timing synchronization unit and so on are required, resulting in complexity of a system.

Another Korean Patent application Laid-Open No. 10-2000-0031138 relates to a pre-recovery apparatus of a transmission system mixed with linear distortion and non-linear distortion and a method for detecting a delay and a phase difference between a transmission signal and a feedback signal. It is, therefore, an object of this application to provide a pre-recovery apparatus including a pre-distortion device and a pre-equalizer for recovering the delay or the phase difference between the transmission signal and the feedback signal. In order to achieve this recovery, the pre-equalizer is allocated inside a transmitter and the pre-distortion device functions as a demodulating multiplier at each in-phase (I) and Quadrature (Q) channels. Also, in order to recover nonlinear and linear distortions, a digital signal processor has a switch at a portion that brings feedback signal and sends a value of a reference table to the demodulating multiplier through the use of an address generator so as to operate the pre-distortion device. When interlocking the operation of the pre-distortion device, the nonlinear distortion device recovers nonlinear distortion by using the switch and then the pre-equalizer recovers linear distortion. At this time, the function of the pre-distortion device is improved further by recovering the delay and the phase difference of the feedback signal.

However, the transmitter and the pre-recovery apparatus in the above are always connected in an on-line mode and processed with a software program. Therefore, the amount of data processed in the transmitter substantially augments, resulting in a problem of overloads in the transmitter.

SUMMARY OF THE INVENTION

It is, therefore, an object of the present invention to provide a pre-distortion apparatus, capable of recovering nonlinear distortion of a high power amplifier by which the pre-distortion apparatus exacts and stores a part of an output signal from the high power amplifier, and then calculates a pre-distortion coefficient and an operational method thereof, and a computer readable recording medium for implementing the method is recorded.

In accordance with an aspect of the present invention, there is provided a pre-distortion apparatus for recovering nonlinear distortion of a high power amplifier, comprising: a demodulator for demodulating a signal outputted from the high power amplifier, generating a demodulated signal; a first storage unit for storing the demodulated signal outputted from the demodulator; a second storage unit for storing a reference transmission signal outputted from a transmitter of a transmitting system; a digital signal processor for calculating a pre-distortion coefficient by comparing the demodulated signal and the reference transmission signal stored at the first storage unit and the second storage unit; and a third storage unit for storing the pre-distortion coefficient calculated at the digital signal processor.

In accordance with another aspect of the present invention, there is provided a telecommunication system for recovering nonlinear distortion of a transmission signal to be transmitted, comprising: a transmitter unit for modulating a transmission signal to be transmitted and generating a modulated signal; a high power amplifier for amplifying the modulated signal; and a pre-distortion unit for recovering nonlinear distortion of the high power amplifier, wherein the pre-distortion unit includes: a demodulator for demodulating a signal outputted from the high power amplifier, generating a demodulated signal; a first storage unit for storing the demodulated signal outputted from the demodulator; a second storage unit for storing a reference transmission signal outputted from a transmitter of a transmitting system; a digital signal processor for calculating a pre-distortion coefficient by comparing the demodulated signal and the reference transmission signal stored at the first storage unit and the second storage unit; and a third storage unit for storing the pre-distortion coefficient calculated at the digital signal processor.

In accordance with further another aspect of the present invention, there is provided a method for recovering nonlinear distortion of a high power amplifier in a telecommunication system, comprising the steps of: (a) storing a reference transmission signal outputted from a transmitter in the telecommunication system; (b) demodulating a signal that is fed back from the high power amplifier, generating a demodulated signal and storing the demodulated signal; (c) at a digital signal processor, calculating a pre-distortion coefficient by comparing the reference transmission signal and the demodulated signal; (d) storing the pre-distortion coefficient into a look-up table; and (e) transmitting the pre-distortion coefficient stored at the look-up table to a complex multiplier of the transmitter.

In accordance with still further another aspect of the present invention, there is provided a computer readable recording medium storing instructions for implementing a method for recovering nonlinear distortion of a high power amplifier, the method comprising the steps of: (a) storing a reference transmission signal outputted from a transmitter in the telecommunication system; (b) demodulating a signal that is fed back from the high power amplifier, generating a demodulated signal and storing the demodulated signal; (c) at a digital signal processor, calculating a pre-distortion coefficient by comparing the reference transmission signal and the demodulated signal; (d) storing the pre-distortion coefficient into a look-up table; and (e) transmitting the pre-distortion coefficient stored at the look-up table to a complex multiplier of the transmitter.

BRIEF DESCRIPTION OF THE DRAWING(S)

The above and other objects and features of the present invention will become apparent from the following description of the preferred embodiments given in conjunction with the accompanying drawings, in which:

FIG. 2 is an exemplary diagram of a transmission system to which the present invention is applied;

FIG. 5 is a flowchart demonstrating a pre-distortion method for recovering nonlinear distortion of the high power amplifier in accordance with the present invention.

DETAILED DESCRIPTION OF THE INVENTION

Figure 1A:
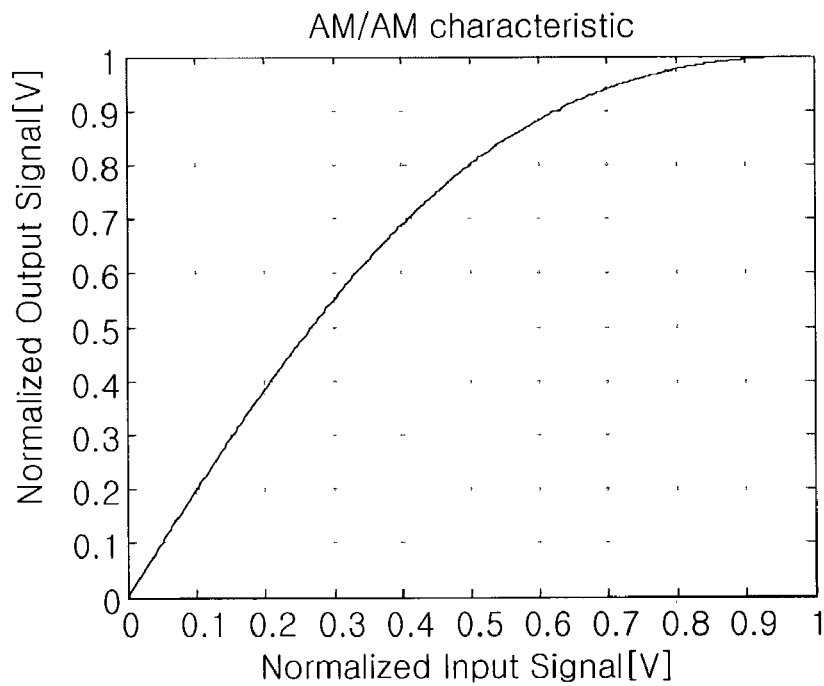
FIGS. 1A and 1B are graphs depicting nonlinear input and output characteristics of a general high power amplifier.
Figure 1B:
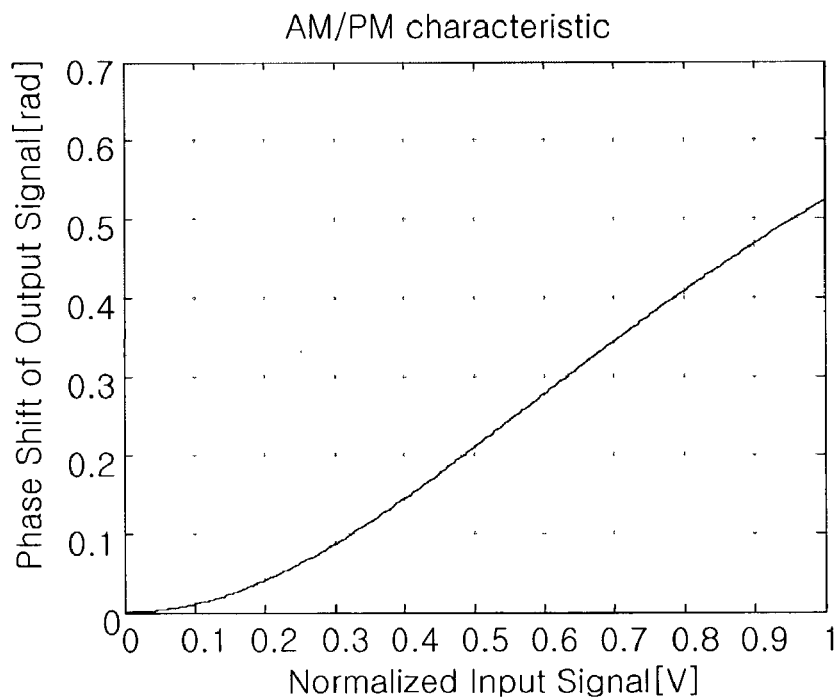

Other objects and aspects of the invention will become apparent from the following description of the embodiments with reference to the accompanying drawings, which is set forth hereinafter.

FIG. 2 is an exemplary diagram showing constitutions of a transmission system to which the present invention is applied and represents associated relationships among a pre-distortion apparatus, a transmitter and a high power amplifier.

Referring to FIG. 2, the reference numeral 210, 220 and 230 denote a vestigial sideband (VSB) transmitter, a high power amplifier and a pre-distortion apparatus, respectively.

The VSB transmitter 210 includes a VSB modulator and a frequency up converter and interfaces with the pre-distortion apparatus 230. Also, an output of the VSB transmitter 210 is amplified through the high power amplifier 220 and sent to a transmitting antenna. At this time, an output signal of the high power amplifier 220 is put into a feedback loop of the pre-distortion apparatus 230.

The pre-distortion apparatus 230 includes a VSB demodulator, a frequency down converter and a digital signal processor.

A system clock receives and processes the output from the VSB transmitter 210 in order to operate the pre-distortion apparatus 230. Also, a reference signal for calculating a pre-distortion coefficient is received as a form of a complex signal from the VSB transmitter 210, and the pre-distortion coefficient calculated at the digital signal processor of the pre-distortion apparatus 230 is sent back to the VSB transmitter 210. In this case, a dotted line appeared in FIG. 2 represents off-line operation. This off-line operation provides advantages that it is less complex when producing a whole interlocking system and frequencies or a symbol synchronization unit can be easily constructed.

Figure 3:
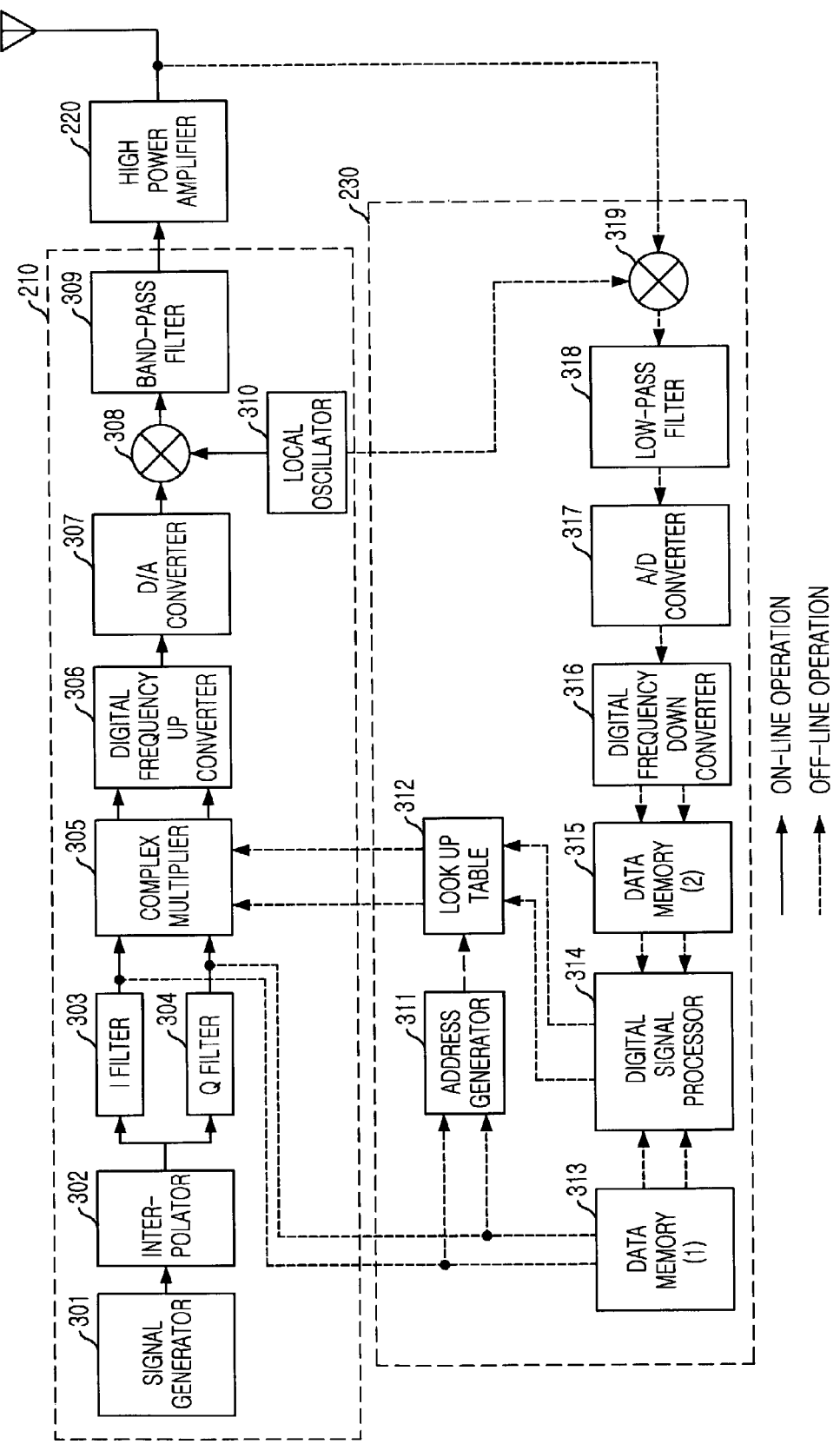
FIG. 3 is a detailed diagram of the transmission system to which the present invention is applied.
Figure 4:
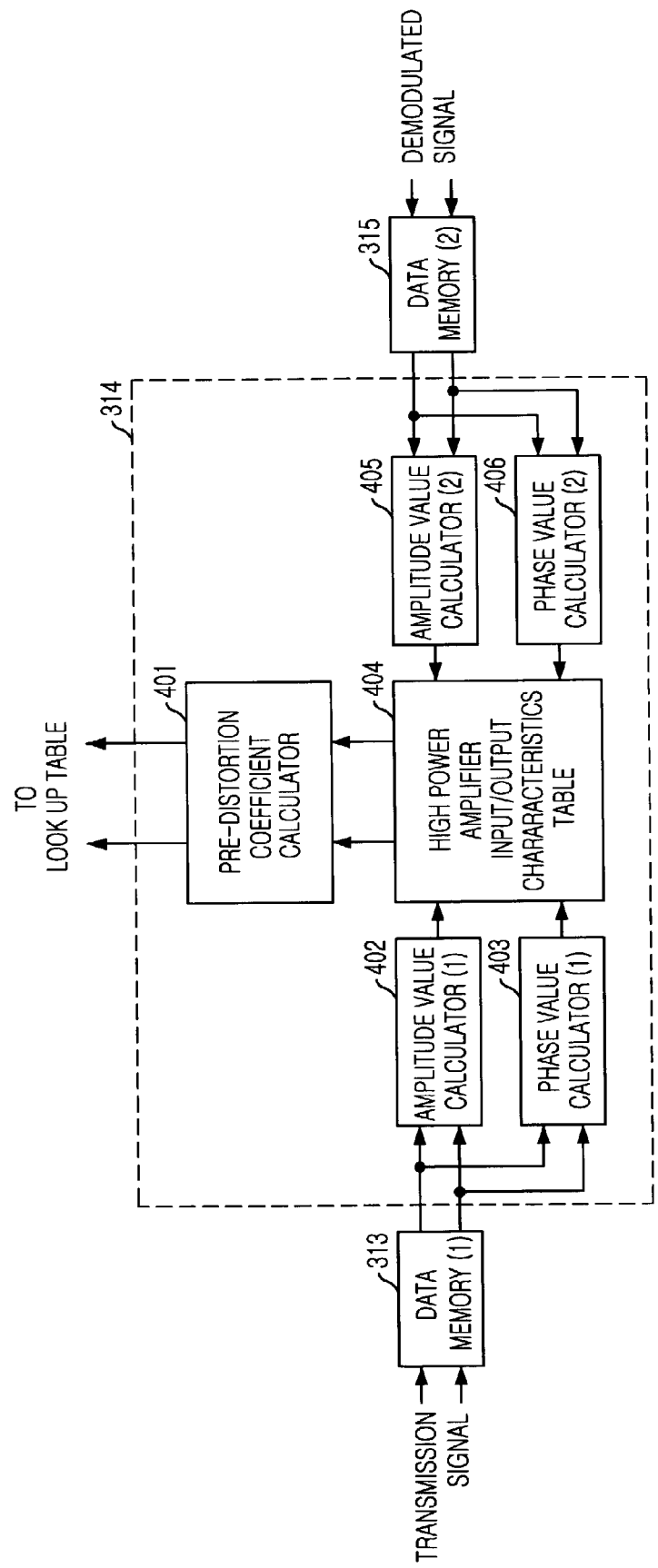
FIG. 4 is a detailed diagram showing a digital signal processor of the pre-distortion apparatus in accordance with the present invention.

FIGS. 3 and 4 describe in more detail in regards to the pre-distortion apparatus for recovering nonlinear distortion of the high power amplifier in accordance with the present invention.

FIG. 3 is a detailed diagram illustrating the constitutions of the transmission system to which the present invention is applied. Particularly, the transmitter, the high power amplifier and the pre-distortion apparatus in accordance with the present invention will be explained comprehensively in below.

First, the VSB transmitter 210 includes: a signal generator 301 for releasing digital information; an interpolator 302 for interpolating a signal outputted from the signal generator 301 to obtain a VSB modulation; an in-phase (I) filter 303 and a Quadrature (Q) filter 304 for filtering the signal interpolated from the interpolator 302; a complex multiplier 305 for complex multiplying the outputted signal provided from the I filter 303 and the Q filter 304 with the pre-distortion coefficient provided from the pre-distortion apparatus 230 and outputting the pre-distorted signal; a digital frequency up converter 306 for converting the pre-distorted signal outputted from the complex multiplier 305 into the signal added with I and Q signals; a digital/analog (D/A) converter 307 for converting the digital signal outputted from the digital frequency up converter 306 into an analog signal; the frequency up converter 308 for ascending a frequency of the signal outputted from the D/A converter 307 as the same level of a frequency outputted from a local oscillator 310; and a band-pass filter 309 for eliminating a unnecessary spectrum in the signal outputted from the frequency up converter 308.

Also, the high power amplifier 220 amplifies the signal passed through the band-pass filter 309.

Meanwhile, the pre-distortion apparatus in accordance with the present invention includes a frequency down converter 319 for descending a frequency of the signal outputted from the high power amplifier 220 through the use of a frequency of the local oscillator 310; a low-pass filter 318 for eliminating a spectrum except for a transmission band from the signal outputted from the frequency down converter 319; an analog/digital (A/D) converter 317 for converting the analog signal outputted from the low-pass filter 318 into a digital signal; a digital frequency down converter 316 for descending the frequency of the digital signal outputted from the A/D converter 317; a data memory [2] 315 for storing the signal outputted from the digital frequency down converter 316; an address generator 311 for generating an address by using the signal outputted from the I filter 303 and Q filter 304; a data memory [1] 313 for storing the signal outputted from the I filter 303 and the Q filter 304; a digital signal processor 314 for calculating the pre-distortion coefficient by comparing each signal stored at the data memory [1] 313 and the data memory [2] 315; and a look-up table for storing the pre-distortion coefficient calculated at the digital signal processor 314 by referring to the output released from the address generator 311.

The associated relationships among the VSB transmitter 210, the high power amplifier 220 and the pre-distortion apparatus 230 will be described in more detail.

First, the VSB transmitter 210 includes the signal generator 301, which is a substitutive expression of a device able to receive video data, audio data or etc. from an external source.

An output of the signal generator 301 is inputted to the interpolator 302 to be over-sampled with a frequency higher than a symbol ratio. A VSB spectrum over the signal outputted from the interpolator 302 is obtained by the VSB filter including the I filter 303 and the Q filter 304. Then, the VSB spectrum and the pre-distortion coefficient stored into the look-up table 312 of the pre-distortion apparatus 230 are sent to the complex multiplier 305.

The pre-distorted signal is transmitted to the digital frequency up converter 306 to be converted as a signal added with the I and the Q signals, and converted again as an analog signal through the D/A converter 307.

The frequency up converter 308 ascends a frequency of the output released from the D/A converter 307 as the same frequency of the local oscillator 310. This ascended frequency is passed through the band-pass filter 309 to eliminate an unnecessary spectrum and finally transmitted through the high power amplifier 220.

The signal outputted from the high power amplifier 220 is put into a feedback loop, i.e. returns to the pre-distortion apparatus 230 to perform descending of the frequency at the frequency down converter 319. At this time, the frequency down converter 319 uses the frequency of the local oscillator 310 included in the VSB transmitter 210.

The frequency-descended signal at the frequency down converter 319 is passed through the low-pass filter 318 to eliminate a spectrum except for the transmission band and sent to the A/D 317 to be converted as a digital signal.

The output from the A/D converter 317 passes through the digital frequency down converter 316 to be stored at the data memory [2] 315. Also, the output signal from the I filter 303 and the Q filter 304 is inputted to the address generator 311 and stored into the data memory [1] 313.

The digital signal processor 314 compares the signals each stored at the data memory [1] 313 and the data memory [2] 315 to calculate a pre-distortion coefficient. This calculated pre-distortion coefficient is stored into the look-up table 312.

Referring to the address generator 311 the pre-distortion coefficient stored at the look-up table is sent to the complex multiplier 305.

The complex multiplier 305 multiplies the pre-distortion coefficient stored at the look-up table 312 and the output signal from the I and Q filters 303 and 304 so that the pre-distortion apparatus 230 can be operated in accordance with this complex multiplied value. In this case, the, pre-distortion coefficient calculated at the digital signal processor 314 uses complex signals stored at the data memory [1] 313 and the data memory [2] 314, thereby being capable of calculating even in an off-line mode.

FIG. 4 is a detailed diagram showing the digital signal processor of the pre-distortion apparatus 230 in accordance with the present invention.

As illustrated in FIG. 4, the digital signal processor 314 of the pre-distortion apparatus 230 in accordance with the present invention includes: an amplitude value calculator [1] 402 for calculating an amplitude value of the complex signal outputted from the data memory [1] 313; a phase value calculator [1] 403 for calculating a phase value of the complex signal outputted from the data memory [1] 313; an amplitude value calculator [2] 405 for calculating an amplitude value of the complex signal outputted from the data memory [2] 315; a phase value calculator [2] 406 for calculating a phase value of the complex signal outputted from the data memory [2] 315; a high power amplifier input/output characteristic table 404 for comparing each calculated amplitude values and the each calculated values to store the results of each comparison; and a pre-distortion coefficient calculator 401 for calculating the pre-distortion coefficient based on the compared values provided from the high power amplifier input/output characteristics table 404.

Procedures for operating the digital signal processor 314 will be explained in detail.

The transmission signal stored at the data memory [1] 313, that is, the reference signal is inputted to the amplitude value calculator [1] 402 and the phase value calculator [1] 403 so to calculate the amplitude and the phase values of the transmission signal. Also, the complex signal stored at the data memory [2] 315 is inputted to the amplitude value calculator [2] 405 and the phase value calculator [2] 406 so as to calculate the amplitude and phase values. The amplitude values each calculated at the amplitude value calculator [1] 402 and the amplitude value calculator [2] 405 and the phase values each calculated at the phase value calculator [1] 403 and the phase value calculator [2] 406 are compared to each other by referring to the high power amplifier input/output characteristics table 404, and then, the pre-distortion coefficient calculator 401 calculates the pre-distortion coefficient to be stored into the look-up table 312. In this case, the frequency of the complex signal and the symbol timing synchronization can be easily constructed through the use of the data memory [1] 313 and the data memory [2] 315.

Calculation procedures for the complex coefficient used for pre-distortion will be described in more detail.

Firstly, since the look-up table 312 of the pre-distortion apparatus 230 is not set with initialization, components (in this case, the frequency down converter 319, the low-pass filter 318, the A/D converter 317 and the digital frequency down converter 316) that demodulate the output signal of the high power amplifier 220 after getting feedback and this demodulated signal contains solely information on non-linearity of the high power amplifier 220. This received signal is accumulated as amplitudes and phases and their average values are calculated to obtain an output function property of the high power amplifier 220.

Table 1 provided in below represents the input/output function property of the high power amplifier 220 obtained from the accumulative average values of the received signal.

TABLE 1

| NUMBER | HIGH POWER AMPLIFIER INPUT SIGNAL LEVEL | HIGH POWER AMPLIFIER OUTPUT SIGNAL LEVEL | HIGH POWER OUTPUT SIGNAL PHASE |
|---|---|---|---|
| 1 | 0.0000 | 0.0190 | 0.0001 |
| 2 | 0.0323 | 0.0709 | 0.0014 |
| 3 | 0.0645 | 0.1294 | 0.0045 |
| 4 | 0.0968 | 0.1927 | 0.0099 |
| 5 | 0.1290 | 0.2554 | 0.0175 |
| 6 | 0.1613 | 0.3143 | 0.0266 |
| 7 | 0.1935 | 0.3733 | 0.0380 |
| 8 | 0.2258 | 0.4293 | 0.0508 |
| 9 | 0.2581 | 0.4842 | 0.0656 |
| 10 | 0.2903 | 0.5358 | 0.0816 |
| 11 | 0.3226 | 0.5847 | 0.0990 |
| 12 | 0.3548 | 0.6303 | 0.1171 |

TABLE 1-continued

| NUMBER | HIGH POWER AMPLIFIER INPUT SIGNAL LEVEL | HIGH POWER AMPLIFIER OUTPUT SIGNAL LEVEL | HIGH POWER OUTPUT SIGNAL PHASE |
|---|---|---|---|
| 13 | 0.3871 | 0.6730 | 0.1364 |
| 14 | 0.4194 | 0.7125 | 0.1564 |
| 15 | 0.4516 | 0.7494 | 0.1771 |
| 16 | 0.4839 | 0.7839 | 0.1986 |
| 17 | 0.5161 | 0.8147 | 0.2202 |
| 18 | 0.5484 | 0.8425 | 0.2416 |
| 19 | 0.5806 | 0.8676 | 0.2634 |
| 20 | 0.6129 | 0.8901 | 0.2851 |
| 21 | 0.6452 | 0.9107 | 0.3074 |
| 22 | 0.6774 | 0.9227 | 0.3283 |
| 23 | 0.7097 | 0.9437 | 0.3505 |
| 24 | 0.7419 | 0.9567 | 0.3713 |
| 25 | 0.7742 | 0.9681 | 0.3294 |
| 26 | 0.8065 | 0.9770 | 0.4119 |
| 27 | 0.8387 | 0.9842 | 0.4309 |
| 28 | 0.8710 | 0.9901 | 0.4501 |
| 29 | 0.9032 | 0.9938 | 0.4653 |
| 30 | 0.9355 | 0.9982 | 0.4918 |
| 31 | 0.9677 | 0.9999 | 0.5182 |
| 32 | 1.0000 | 1.0000 | 0.5185 |

After obtaining the output function property of the high power amplifier 220, an inverse function with respect to the input of the high power amplifier is calculated through the use of Table 1. Generally, it is a common misconception that calculation of a ratio in the input signal level to the output signal level is that of the inverse function of the high power amplifier 220. For instance, if the input signal level of the high power amplifier in an ordinal order of 23 in the above Table 1 of which value is "0.7097" is assumed to be inputted to the high power amplifier, then, the output signal level of the high power amplifier becomes "0.9437". All of these values are normalized so that a gaining value of the high power amplifier is to be "1". In this case, since the gaining value between the input signal level and the output signal level is "1.3297", the input signal level becomes "0.5337" when the input signal level is divided by the gaining value. Because of this change of the input signal level, the output signal level becomes approximately "0.8425" with reference to Table 1. Therefore, it is not possible to obtain the desired output value. This result is caused by the fact that the amplitude modulation/amplitude modulation (AM/AM) mode of the high power amplifier 220 is not the first linear equation.

If the output signal level of the high power amplifier 220 with respect to the input signal level, "0.7097", is to be "0.7097", the input that leads the output to be "0.7097" is searched in the above Table 1. The fourteenth input data in Table 1 of which value is "0.4194", corresponds to the above condition and the gaining value with respect to the twenty third address of the look-up table becomes 0.5910 by dividing the value "0.4194" with the value "0.7097".

The modulated signal level is assumed to be "0.7097" which corresponds to the twenty third address of the look-up table, and the gaining value of the pre-distortion apparatus is "0.591". Therefore, the output of the pre-distortion apparatus becomes "0.4194" by multiplying the gaining value with the modulated signal level and the output value is obtained as "0.7125" from Table 1 by passing through the high power amplifier. This output signal level, "0.7125", has a slight distortion; however, this distortion can be reduced sufficiently by increasing the number of levels. In other words, the number of levels in Table 1 is represented as "32", however, the distortion can be reduced by increasing the number of levels.

To recover distortion with respect to distortion of the amplitude modulation/phase modulation (AM/PM) mode, as similar to the procedure for recovering the distortion generated from the amplitude modulation/amplitude modulation (AM/AM) mode, the output signal level is searched as close to "0.7097" with respect to the input signal level, "0.7097". This output signal level corresponds to the fourteenth input, "0.4194". In this case, phase is shifted to a degree of "0.1564". Accordingly, it is possible to make a phase shift first by "exp(-jO.1564°)" with respect to the input signal of the pre-distortion apparatus. In this case, the phase deviation is eliminated because the phase properties are mutually canceled to each other.

It is possible to initialize more rapidly and improve functions by following the method for generating the look-up table as described the above. Also, due to the use of random 8-VSB signals, the look-up table of the pre-distortion apparatus can be adaptively renewable in accordance with durational changes of the high power amplifier.

FIG. 5 is a flowchart demonstrating a method of pre-distortion for recovering nonlinear distortion of the high power amplifier in accordance with the present invention.

Referring to FIG. 5, at Step 501, the transmitter firstly stores a transmitting signal. At this time, the transmitting signal outputted from the transmitter is a signal that passed through the I and the Q filters of the transmitter and is inputted into the address generator to be used for releasing an address as a reference for the look-up table.

Next, at Step 502, the signal that gets feedback at the high power amplifier is demodulated and stored.

Then, at Step 503, a pre-distortion coefficient is calculated at the digital signal processor by using the stored transmitting signal and the demodulated signal. The calculated pre-distortion coefficient is stored into the look-up table at Step 504.

The pre-distortion coefficient stored at the look-up table is transmitted to the complex multiplier.

Meanwhile, the process for calculating the pre-distortion coefficient at the digital signal processor through the use of the transmitting signal and the demodulated signal starts with calculating an amplitude value and a phase value of the stored transmitting signal and the demodulated signal at the corresponding amplitude and the phase value calculators. Based on these calculations, the pre-distortion coefficient is subsequently calculated with reference to the high power amplifier input/output characteristics table.

As demonstrated the above steps, it is possible to calculate even in an off-line mode since the pre-distortion coefficient is calculated after storing the transmitting signal and the demodulated signal.

Also, the present invention provides a computer readable recording medium storing instructions for implementing the method and a CD-ROM, a RAM, a ROM, a floppy disk, a hard disk, a magneto-optical disk and the like are examples of the computer readable recording medium.

As described in the above-preferred embodiment, the present invention employs a procedure wherein a partial portion of the output signal is exacted and stored so that the pre-distortion coefficient can be calculated even in the off-line mode. This procedure, therefore, provides advantages of convenient constructions of the pre-distortion apparatus and the driving method thereof as well as the frequency and symbol synchronization.

While the present invention has been described with respect to certain preferred embodiments, it will be apparent to those skilled in the art that various changes and modifications may be made without departing from the scope of the invention as defined in the following claims.

What is claimed is:

1. A pre-distortion apparatus for recovering nonlinear distortion of a high power amplifier, comprising:
   a demodulator for demodulating a signal outputted from the high power amplifier, generating a demodulated signal;
   a first storage means for storing the demodulated signal outputted from the demodulator;
   a second storage means for storing a reference transmission signal outputted from a transmitter of a transmitting system;
   a digital signal processor for calculating a pre-distortion coefficient by comparing the demodulated signal and the reference transmission signal stored at the first storage means and the second storage means; and
   a third storage means for storing the pre-distortion coefficient calculated at the digital signal processor;
   wherein the digital signal processor comprises:
      an input/output characteristics storage means for storing amplitude and phase characteristics of a high power amplifier; and
      a pre-distortion coefficient calculator for calculating the pre-distortion coefficient by comparing amplitude values and phase values of the stored demodulated signal and the stored reference transmission signal with the amplitude and phase characteristics of the high power amplifier.

2. The pre-distortion apparatus as recited in claim 1, wherein the demodulator includes:
   a frequency down converter for descending a frequency of the signal outputted from the high power amplifier;
   a filter for eliminating a spectrum except for a transmission band from the outputted signal at the frequency down converter;
   a converter for converting an analog signal outputted from the filter into a digital signal; and
   a digital frequency down converter for descending a frequency of the digital signal outputted from the converter.

3. The pre-distortion apparatus as recited in claim 1, wherein the digital signal processor includes:
   a first amplitude value calculator for calculating the amplitude values of a complex signal outputted from the second storage means;
   a first phase value calculator for calculating the phase values of the complex signal outputted from the second storage means;
   a second amplitude value calculator for calculating the amplitude values of a complex signal outputted from the first storage means; and
   a second phase value calculator for calculating the phase values of the complex signal outputted from the first storage means.

4. The pre-distortion apparatus as recited claim 1, wherein the third storage means stores the pre-distortion coefficient calculated at the digital signal processor through the use of the address released by processing the reference transmission signal outputted from the transmitter.

5. A telecommunication system for recovering nonlinear distortion of a transmission signal to be transmitted, comprising:
   a transmitter means for modulating a transmission signal to be transmitted and generating a modulated signal;

a high power amplifier for amplifying the modulated signal; and a pre-distortion means for recovering nonlinear distortion of the high power amplifier, wherein the pre-distortion means includes:

a demodulator for demodulating a signal outputted from the high power amplifier, generating a demodulated signal;

a first storage means for storing the demodulated signal outputted from the demodulator;

a second storage means for storing a reference transmission signal outputted from a transmitter of a transmitting system;

a digital signal processor for calculating a pre-distortion coefficient by comparing the demodulated signal and the reference transmission signal stored at the first storage means and the second storage means; and a third storage means for storing the pre-distortion coefficient calculated at the digital signal processor;

wherein the digital signal processor comprises:

an input/output characteristics storage means for storing amplitude and phase characteristics of a high power amplifier; and a pre-distortion coefficient calculator for calculating the pre-distortion coefficient by comparing amplitude values and phase values of the stored demodulated signal and the stored reference transmission signal with the amplitude and phase characteristics of the high power amplifier.

6. The telecommunication system as recited in claim 5, wherein the transmitter includes:

a signal generator for generating digital information;

an interpolator for interpolating the digital information outputted from the signal generator and generating an interpolated signal;

a complex signal filter for filtering the interpolated signal, which a complex signal, and generating a filtered signal;

a complex multiplier for multiplying the filtered signal outputted from the complex signal filter and a pre-distortion coefficient provided from the pre-distortion means and generating a pre-distorted signal;

a digital frequency up converter for converting the pre-distorted signal outputted from the complex multiplier into a signal added with an in-phase (I) signal and a Quadrature (Q) signal;

a digital/analog converter for converting the digital signal outputted from the digital frequency up converter into an analog signal;

a local oscillator for generating a frequency to be used for transmission;

a frequency up converter for ascending a frequency of the signal outputted from the digital/analog converter as the same frequency outputted from the local oscillator; and a band-pass filter for eliminating an unnecessary spectrum of the signal outputted from the frequency up converter.

7. The telecommunication system as recited in claim 5, wherein the demodulator includes:

a frequency down converter for descending a frequency of the signal outputted from the high power amplifier;

a filter for eliminating a spectrum except for a transmission band from the outputted signal at the frequency down converter;

a converter for converting an analog signal outputted from the filter into a digital signal; and a digital frequency down converter for descending a frequency of the digital signal outputted from the converter.

8. The telecommunication system as recited in claim 5, wherein the digital signal processor includes:

a first amplitude value calculator for calculating the amplitude values of a complex signal outputted from the second storage means;

a first phase value calculator for calculating the phase values of the complex signal outputted from the second storage means;

a second amplitude value calculator for calculating the amplitude values of a complex signal outputted from the first storage means; and a second phase value calculator for calculating the phase values of the complex signal outputted from the first storage means.

9. A method for recovering nonlinear distortion of a high power amplifier in a telecommunication system, comprising the steps of:

(a) storing a reference transmission signal outputted from a transmitter in the telecommunication system;

(b) demodulating a signal that is fed back from the high power amplifier, generating a demodulated signal and storing the demodulated signal;

(c) at a digital signal processor, calculating a pre-distortion coefficient, wherein the calculation comprises:

calculating an amplitude value and a phase value of the reference transmission signal and the demodulated signal; and comparing each calculated amplitude value and each calculated phase value with amplitude and phase characteristics of a high power amplifier stored in an input/output characteristics storage;

(d) storing the pre-distortion coefficient into a look-up table; and (e) transmitting the pre-distortion coefficient stored at the look-up table to a complex multiplier of the transmitter.

10. The method as recited in claim 9, wherein the reference transmission signal generated is a signal that passed through an in-phase (I) filter and a Quadrature (Q) filter and is inputted into an address generator so as to be used in releasing referential addresses at the look-up table.

11. A computer readable recording medium storing instructions for implementing a method for recovering nonlinear distortion of a high power amplifier, the method comprising the steps of:

(a) storing a reference transmission signal outputted from a transmitter in the telecommunication system;

(b) demodulating a signal that is fed back from the high power amplifier, generating a demodulated signal and storing the demodulated signal;

(c) at a digital signal processor, calculating a pre-distortion coefficient, wherein the calculation comprises:

calculating an amplitude value and a phase value of the reference transmission signal and the demodulated signal; and comparing each calculated amplitude value and each calculated phase value with amplitude and phase characteristics of a high power amplifier stored in an input/output characteristics storage;

(d) storing the pre-distortion coefficient into a look-up table; and (e) transmitting the pre-distortion coefficient stored at the look-up table to a complex multiplier of the transmitter.

* * * * *